(12) United States Patent
Hori

(10) Patent No.: US 7,839,172 B2
(45) Date of Patent: Nov. 23, 2010

(54) BIDIRECTIONAL BUFFER CIRCUIT AND SIGNAL LEVEL CONVERSION CIRCUIT

(75) Inventor: Chikahiro Hori, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/472,443

(22) Filed: May 27, 2009

(65) Prior Publication Data

US 2009/0295429 A1 Dec. 3, 2009

(30) Foreign Application Priority Data

Jun. 3, 2008 (JP) .............................. 2008-145562

(51) Int. Cl.
*H03K 19/0175* (2006.01)
(52) U.S. Cl. .......................................... 326/80; 326/82
(58) Field of Classification Search ............. 326/80–87; 327/111
See application file for complete search history.

(56) References Cited

U.S. PATENT DOCUMENTS

| | | | | |
|---|---|---|---|---|
| 5,079,693 A | * | 1/1992 | Miller | 711/156 |
| 5,202,593 A | * | 4/1993 | Huang et al. | 326/86 |
| 5,424,659 A | * | 6/1995 | Stephens et al. | 326/81 |
| 5,426,738 A | * | 6/1995 | Hsieh et al. | 326/38 |
| 5,428,800 A | * | 6/1995 | Hsieh et al. | 326/82 |
| 5,852,617 A | * | 12/1998 | Mote, Jr. | 714/726 |
| 5,923,187 A | * | 7/1999 | Maugars | 326/86 |
| 6,130,563 A | * | 10/2000 | Pilling et al. | 327/111 |
| 6,359,471 B1 | * | 3/2002 | Mueller et al. | 326/81 |
| 7,208,979 B2 | | 4/2007 | Takiba | |
| 7,358,773 B2 | | 4/2008 | Takiba | |

FOREIGN PATENT DOCUMENTS

JP 2005-176172 6/2005

* cited by examiner

*Primary Examiner*—Rexford N Barnie
*Assistant Examiner*—Crystal L Hammond
(74) *Attorney, Agent, or Firm*—Turocy & Watson, LLP

(57) ABSTRACT

A bidirectional buffer circuit includes a first terminal, a second terminal, a first output buffer to which a signal from the first terminal is input and which outputs the signal to the second terminal, a first one-shot buffer control circuit outputting a first control signal according to an earlier arriving signal out of a signal from the first terminal and a signal from the second terminal, a first one-shot buffer temporarily driving the second terminal by the first control signal, a second output buffer to which a signal from the second terminal is input and which outputs the signal to the first terminal, a second one-shot buffer control circuit outputting a second control signal according to an earlier arriving signal out of a signal from the first terminal and a signal from the second terminal, and a second one-shot buffer temporarily driving the first terminal by the second control signal.

20 Claims, 7 Drawing Sheets

EXTERNAL SIGNAL
(INPUT TO TERMINAL A)

OUTPUT OF INPUT
BUFFER 10 ON TERMINAL
A SIDE

INPUT TO ONE-SHOT
BUFFER 44 ON TERMINAL
B SIDE

OUTPUT OF TERMINAL B

OUTPUT OF INPUT
BUFFER 40 ON TERMINAL
B SIDE

INPUT TO ONE-SHOT
BUFFER 14 ON TERMINAL
A SIDE

EXTERNAL SIGNAL
(INPUT TO TERMINAL A)

OUTPUT OF INPUT
BUFFER 11 ON TERMINAL
A SIDE

INPUT TO ONE-SHOT
BUFFER 44 ON TERMINAL
B SIDE

OUTPUT OF TERMINAL B

OUTPUT OF INPUT
BUFFER 41 ON TERMINAL
B SIDE

INPUT TO ONE-SHOT
BUFFER 14 ON TERMINAL
A SIDE

BIDIRECTIONAL BUFFER CIRCUIT AND SIGNAL LEVEL CONVERSION CIRCUIT

CROSS-REFERENCE TO RELATED APPLICATIONS

This application is based upon and claims the benefit of priority from the prior Japanese Patent Application No. 2008-145562, filed on Jun. 3, 2008; the entire contents of which are incorporated herein by reference.

BACKGROUND OF THE INVENTION

1. Field of the Invention

This invention relates to a bidirectional buffer circuit and a signal level conversion circuit.

2. Background Art

In data transmission between electronic devices and between circuits, data transmitting and receiving are often performed alternately, and only one thereof is rarely performed. For example, in memory devices, stored data in a received address are transmitted to a sender in return. In this case, as the data transmitting and receiving are not often performed at the same time, bidirectional communication of transmitting and receiving the data is often performed with sharing one signal line. Thereby, the number of the signal lines can be small, and cost of the communication system can be easily reduced.

When the signal line becomes long, a buffer is required on the way of wiring. Moreover, in the electronic devices and in the circuits, each power voltage of them is not always the same. In the case of different power voltages, a level shifter is required to convert a signal level.

If there is no signal of the transmission direction in the buffer circuit or the level shifter corresponding to the bidirectional signal, a data transmission rate lowers. Using the directional signal, however, the buffer needs another long wire for the directional signal so that the cost increases. Moreover, the buffer circuit or the level shifter may provide an apparatus for determining either the transmitting or the receiving. However, such the apparatus complicates the buffer circuit and the level shifter, and therefore, the cost increases.

An example for a signal level conversion circuit is disclosed in JP-A 2005-176172 (Kokai). In this example, two serially connected inverters, inserted between an input buffer and an output buffer, reduces the number of another elements the stages to simplify its circuit structure. Moreover, the signal level conversion circuit reduces a chip size and a delay of the signal propagation.

However, also this disclosure example, the circuit becomes complex because of using a selective signal for switching the transmission direction of the signal and its structure becomes complex.

SUMMARY OF THE INVENTION

According to an aspect of the invention, there is provided a bidirectional buffer circuit including: a first terminal; a second terminal; a first output buffer to which a signal from the first terminal is input and which outputs the signal to the second terminal; a first one-shot buffer control circuit outputting a first control signal according to an earlier arriving signal out of a signal from the first terminal and a signal from the second terminal; a first one-shot buffer temporarily driving the second terminal by the first control signal; a second output buffer to which a signal from the second terminal is input and which outputs the signal to the first terminal; a second one-shot buffer control circuit outputting a second control signal according to an earlier arriving signal out of a signal from the first terminal and a signal from the second terminal; and a second one-shot buffer temporarily driving the first terminal by the second control signal.

According to another aspect of the invention, there is provided a signal level conversion circuit including: a first terminal to which a signal based on a first power voltage is input and output; a second terminal to which a signal based on a second power voltage is input and output; a first level shifter which is input a signal from the first terminal and which outputs a first level conversion signal; a first output buffer to which the first level conversion signal is input and which outputs the signal to the second terminal; a first one-shot buffer control circuit outputting a first control signal according to an earlier arriving signal out of the first level conversion signal and a signal from the second terminal; a first one-shot buffer temporarily driving the second terminal by the first control signal; a second level shifter to which a signal from the second terminal is input and which outputs a second level conversion signal; a second output buffer to which the second level conversion signal is input and which outputs the signal to the first terminal; a second one-shot buffer control circuit outputting a second control signal according to an earlier arriving signal out of a signal from the first terminal and the second level conversion signal; and a second one-shot buffer temporarily driving the first terminal by the second control signal.

According to still another aspect of the invention, there is provided a signal level conversion circuit including: a first terminal to which a signal based on first power voltage is input and output; a second terminal to which a signal of a second power voltage is input and output; a first input buffer to which a signal from the first terminal is input and which outputs a differential signal; a first differential level shifter configured to output a first level conversion signal on the basis of an output from the first input buffer; a first output buffer to which the first level conversion signal is input and which outputs the signal to the second terminal; a second input buffer to which a signal from the second terminal is input and which outputs a differential signal; a second differential level shifter configured to output a second level conversion signal on the basis of an output from the second input buffer; a second output buffer to which the second level conversion signal is input and which outputs the signal to the first terminal; a first one-shot buffer control circuit outputting a first control signal according to an earlier arriving signal out of the first level conversion signal and a signal from the second terminal; a first one-shot buffer temporarily driving the second terminal by the first control signal; a second one-shot buffer control circuit outputting a second control signal according to an earlier arriving signal out of a signal from the first terminal and the second level conversion signal; and a second one-shot buffer temporarily driving the first terminal by the second control signal.

DETAILED DESCRIPTION OF THE INVENTION

Hereinafter, embodiments of this invention will be explained.

Figure 1:
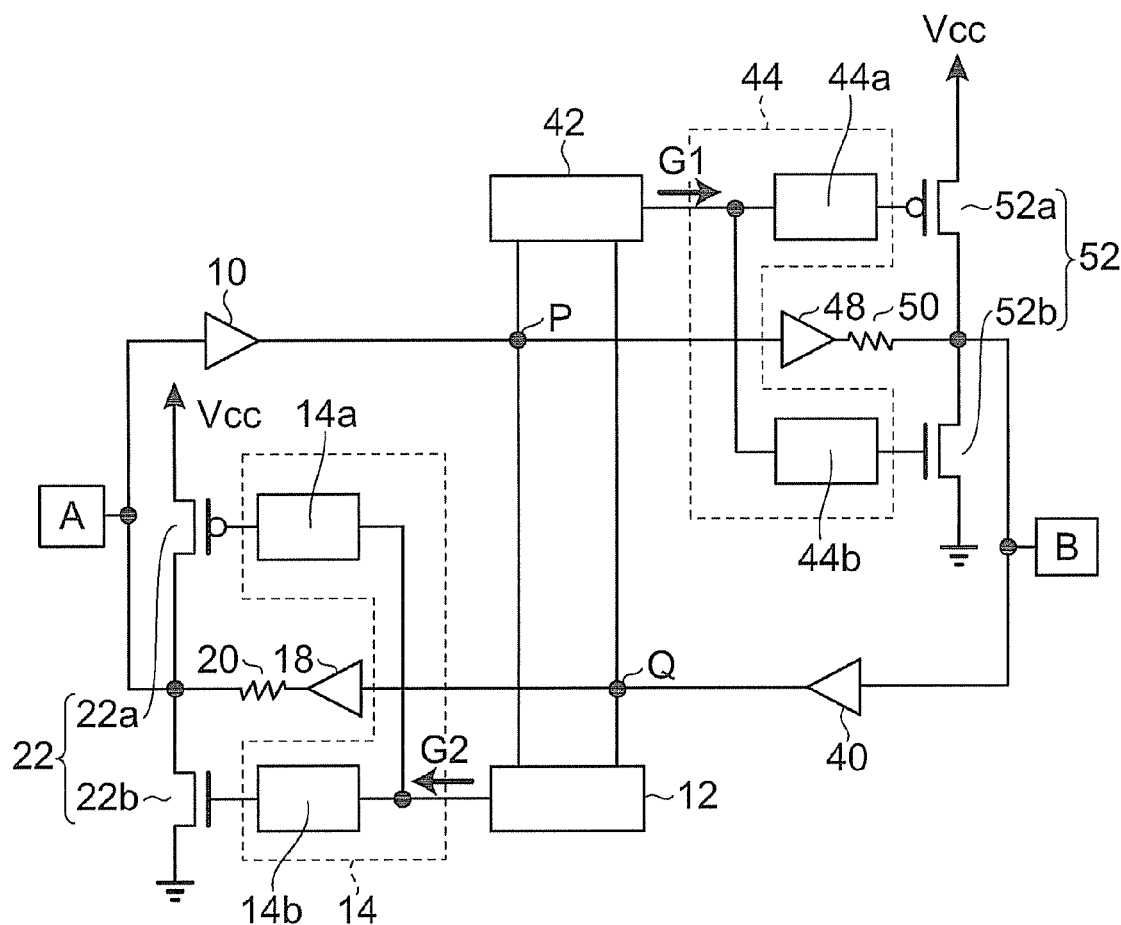
FIG. 1 is a block diagram showing a bidirectional buffer circuit according to a first embodiment.

FIG. 1 shows a block diagram of a bidirectional buffer circuit according to a first embodiment of the invention.

In this embodiment, the bidirectional buffer circuit mutually transmits data between a first terminal A and a second terminal B, and does not use a switching signal representing a transmission direction of a signal. A signal of a logical value of "0" or "1" is input from the terminal A to, for example, a first input buffer 10.

An output of the input buffer 10 is input to a first output buffer 48, and is output to the terminal B through a resistor 50. Moreover, the signal input to the terminal B is input to, for example, a second input buffer 40. An output of the input buffer 40 is input to a second output buffer 18, and output to the terminal A through a resistor 20. The buffer circuit may not the input buffers 10, 40, but when the input buffers are provided, the buffer circuit operates more stably.

As the buffer circuit comprises a data transmission loop having all of the input buffer 10, the output buffer 48, the input buffer 40, and the output buffer 18, the terminal A and B have the same logical value in a steady state.

In this loop, when an external signal different from a logical value holding at the output buffer 18 is input to the terminal A, if the terminal A is not connected to the resistor, the external signal runs against the logical value signal driven by the output buffer 18. However, when the resistor 20 is connected to an output side of the output buffer 18 and the resistance of the resistor 20 is set to be sufficiently high, the driving capability of the output buffer 18 decreases, and thereby, the external signal of the terminal A is qualified as a logical value of the external signal.

Moreover, the external signal input of terminal A is returned through the terminal B by using the loop and drives the terminal A. Driving terminal indicates that voltage of a high level or a low level is applied to the terminal. Therefore, the signal driven by the output buffer 18 is the same as the signal of the terminal A. And the loop operates in a stable state again. However, the resistor 20, 50 weaken the driving capability of the output buffer 18, 48 so that a signal propagation rate lowers. That is a problem.

A second one-shot buffer 14 on the terminal A side and a first one-shot buffer 44 on the terminal B side are disposed for improving the signal propagation rate. A signal at the point P, connecting an output terminal of the input buffer 10 to an input terminal of the output buffer 48, and a signal at the point Q, connecting an output terminal of the input buffer 40 to an input terminal of the output buffer 18, are input to a second one-shot buffer control circuit 12 of the terminal A side. The signal at the point P and the signal at the point Q are also input to a first one-shot buffer control circuit 42 on the terminal B side.

The control circuit 12 can perform logical operations of both the output of the input buffer 10 on the terminal A side and the output of the input buffer 40 on the terminal B side, and can output a second control signal G2 to the one-shot buffer 14. Moreover, the control circuit 42 can also perform logical operations of both the output of the input buffer 40 on the terminal B side and the output of the input buffer 10 on the terminal A side, and can output a first control signal G1 to the one-shot buffer 44 of the terminal B side.

The one-shot buffers 14, 44 can drive switching elements 22, 52 by their outputs, and drive the terminal B and the terminal A, respectively. In FIG. 1, the switching elements 22, 52 provide with, for example, P channel MOSFETs 22a, 52a and N channel MOSFETs 22b, 52b, respectively. The switching elements 22, 52 are not limited to MOSFETs but may be bipolar transistors. However, MOSFETs are more preferable from viewpoints of both common use of its production process with a logical circuit including the control circuit and lower power consumption.

Here, an external signal is input to the terminal A. The external signal reaches the terminal B through the one-shot buffer 44 and the switching element 52, and furthermore, goes through the input buffer 40, and reaches the terminal of the control circuit 42 via the point Q. This path has a longer delay time than a time of a signal reaching the terminal of the control circuit 42 from the point P through the input buffer 10 from the terminal A. That is, the control circuit 42 outputs the first control signal G1 according to earlier arriving signal of the external signal being input to the terminal A. And the control circuit 42 operates the one-shot buffer 44 to drive the switching element 52. Similarly, the control circuit 12 outputs the first control signal G2 according to an earlier arriving signal of the external signal being input to the terminal A. And control circuit 12 operates the one-shot buffer 14 to drive the switching element 22. As described above, the external signal of the terminal A can be transmitted to the terminal B. The external signal being input to the terminal B can also be transmitted to the terminal A.

Figure 2A:
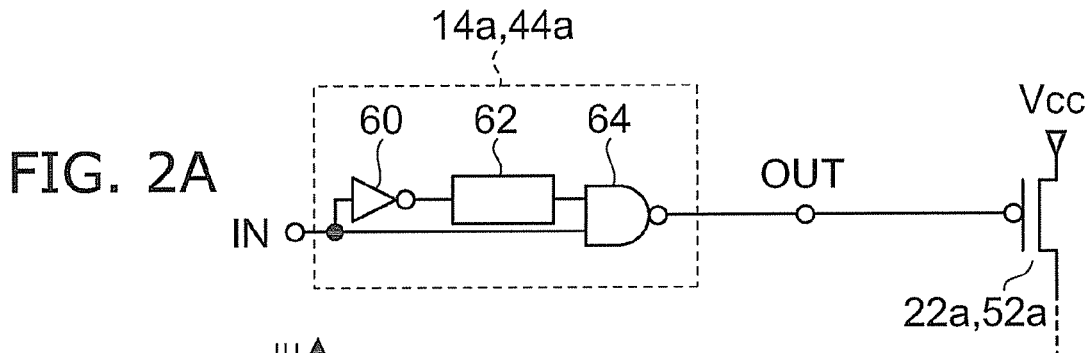
FIGS. 2A to 2F are views showing one example of one-shot buffers.
Figure 2B:
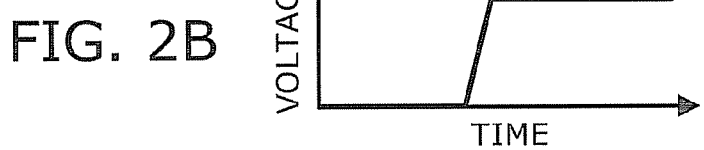
Figure 2C:
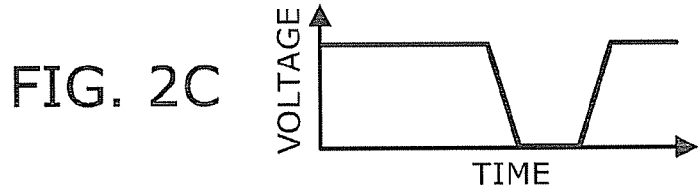

FIG. 2A shows a logic circuit of high one-shot buffers, and FIGS. 2B and 2C show its timing charts.

As shown in FIG. 2A, each of the high one-shot buffers 14a, 44a comprises an inverter 60, a delay circuit 62, and an NAND circuit 64. In a state that an input "0" (low level) to an input terminal (IN) is held for a certain time or more, an output of an output terminal (OUT) is "1" (high level). As shown in FIG. 2B, when the input voltage turns to "1", the output once becomes "0" as shown in FIG. 2C. And after the time adding the delay time of the circuit 62 to the delay time of the inverter 60, the output returns to "1" again.

Then, even when the input turns to "0", any one of the inputs of NAND is "0", and therefore, the output holds "1". That is, the P channel MOSFET 52a does not turn ON. As described above, each of the high one-shot buffers 14a, 44a drives the P-channel MOSFET 52a, 52b only in a limited period that the input turns to "1" from "0".

Figure 2D:
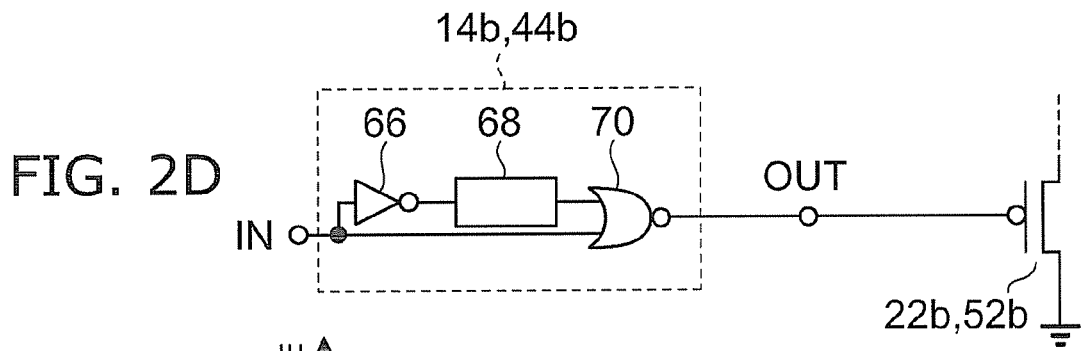
Figure 2E:
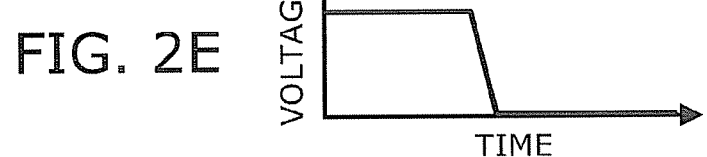
Figure 2F:
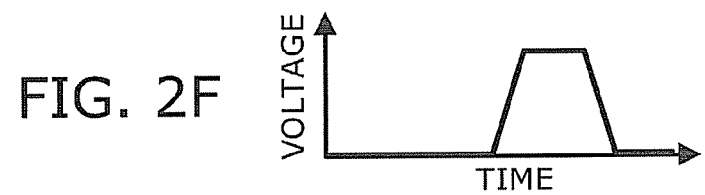

Moreover, FIG. 2D shows a logic circuit of low one-shot buffers, and FIGS. 2E and 2F show its timing charts. Each of the low one-shot buffers 14b, 44b comprises an inverter 66, a delay circuit 68, and an NOR circuit 70. As shown in FIG. 2E, when the input voltage turn to "1" from "0", "1" is output as shown in FIG. 2F in the period that the delay time of the delay circuit is added to the delay time of the inverter 66. The output "1" drives the N-channel MOSFETs 22b, 52b. As described above, the one-shot buffers prevent the propagation rate from lowering even though the resistors 20, 50 are included.

In FIG. 1, the one-shot buffer 14 has the high one-shot buffer 14a and the low one-shot buffer 14b. And the one-shot buffer 44 has the high one-shot buffer 44a and the low one-shot buffer 44b. When a rising external signal is input to the terminal A, the high one-shot buffers 14a, 44a are temporarily driven. And for example, the P-channel MOSFETs 22a, 52a are turned ON.

Moreover, a falling external signal is input to the terminal A, the low one-shot buffers 14b, 44b are temporarily driven.

And for example, the N-channel MOSFETs 22b, 52b are turned ON. As described above, the terminal A and B can be driven.

Figure 3:
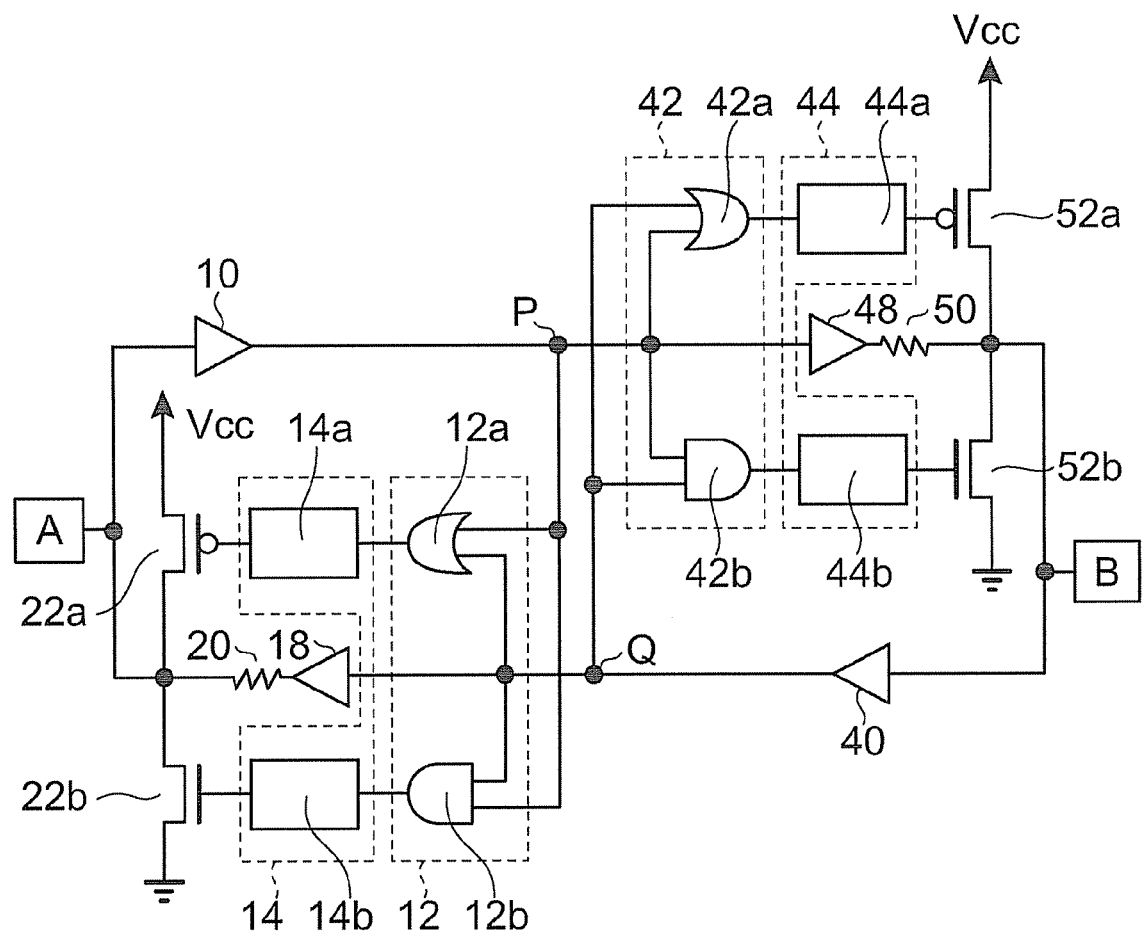
FIG. 3 is a block diagram of a bidirectional buffer circuit according to a second embodiment.

FIG. 3 is a block diagram of a bidirectional buffer circuit according to a second embodiment. The control circuit 12 includes an OR circuit 12a that can drive the high one-shot buffer 14a and an AND circuit 12b that can drive the low one-shot buffer 14b. Similarly, the control circuit 42 includes an OR circuit 42a that can drive the high one-shot buffer 44a and an AND circuit 42b that can drive the low one-shot buffer 44b.

When any one of the inputs of each of the OR circuits 12a, 42a becomes "1", its output becomes "1". Therefore, when two signals rise with time difference, the output rises with following a rapidly changing signal. On the other hand, when any one of the inputs of each of the AND circuits 12b, 42b becomes "0", its output becomes "0". Therefore, when two signals fall with time difference, the output falls with following a rapidly changing signal. As described above, the control circuits 12, 42 can drive the one-shot buffers 14, 44, respectively.

Moreover, FIGS. 4A to 4F are timing charts of the second embodiment. That is, the vertical axis represents voltage, and the horizontal axis represents time.

Figure 4A:
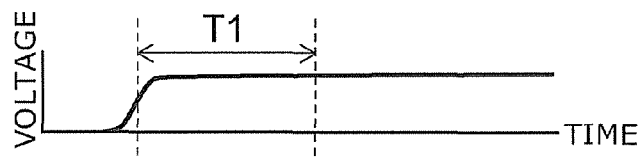
FIGS. 4A to 4F are timing charts describing the operation of the second embodiment.
Figure 4B:
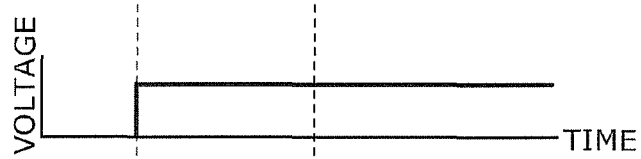

Both terminal A and B have a logical value of "0" in the initial state. If an external signal "1" as shown in FIG. 4A is input to the terminal A, the output of the input buffer 10 rises as shown in FIG. 4B approximately at the same time as rising of the external signal.

Figure 4C:
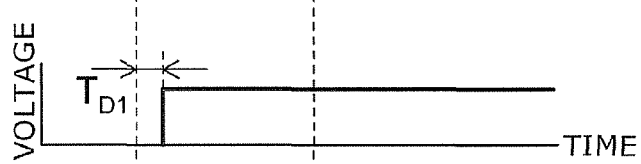

After short delay time $T_{D1}$ with respect to the external signal "1", the external signal reaches the terminal connected to the input point P of the OR circuit 42a on the terminal B side. By following the external signal, an output of the OR circuit 42a turns to "1", and is input to the high one-shot buffer 44a on the terminal B side as shown in FIG. 4C.

The output of the high one-shot buffer 44a to which "1" is input becomes like FIG. 2C, and starts driving of the P-channel MOSFET 52a. As described above, the P channel MOSFET 52 turns ON and temporarily drives strongly the potential of the terminal B to the Vcc side. When the driving is achieved, a gate turns to plus. Therefore, the P-channel MOSFET 52a turns OFF, and a drain side becomes open. In this case, a delay time $T_{D1}$ is shorter than a period that "1" is input to the one-shot buffer 44.

Figure 4D:
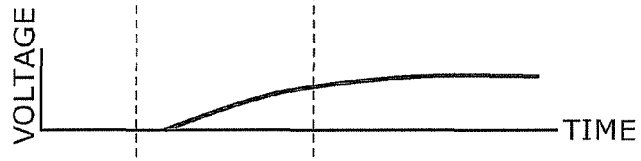
Figure 4E:
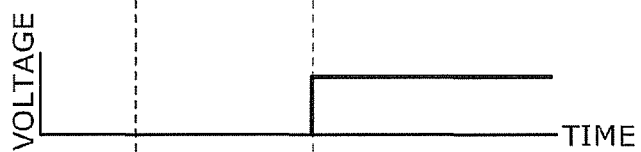

When the terminal B starts to be driven by the high one-shot buffer 44a, the terminal B starts to rise to "1". If an external load on the terminal B side is heavy, rising becomes mild as shown in FIG. 4D. When an output of the terminal B exceeds an input threshold value of the input buffer 40, its output turns to "1" as shown in FIG. 4E. That is, a signal propagation delay time between the output of the input buffer 10 and the output of the input buffer 40 becomes about T1.

Figure 4F:
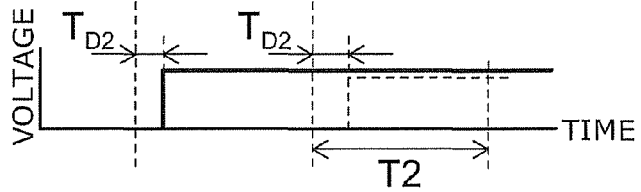

On the other hand, the external signal "1" reaches the terminal connected to the input point P of the OR circuit 12a in the delay time $T_{D2}$, the output of the OR circuit 12a shift to "1" with following the external signal. As a result, as shown in FIG. 4F, "1" is input to the high one-shot buffer 14a on the terminal A side.

The output of the high one-shot buffer 14a to which "1" is input becomes like FIG. 2C, and starts driving of the P-channel MOSFET 22a. As described above, the P-channel MOSFET 22a turns ON and temporarily drives strongly the terminal A to the Vcc side. When driving is completed, the P-channel MOSFET 22a turns OFF, the drain side becomes open. $T_{D1}$ and $T_{D2}$ are often about the same or near values.

Moreover, the external signal is transmitted to the terminal B, and reaches the terminal connected to the input point Q of the OR circuit 12a. In this case, as the input signal to the other terminal is "1", the output of the OR circuit 12a does not change and hold "1" regardless of whether the input signal to the terminal connected to the point Q is "0" or "1". Therefore, the input to the high one-shot buffer 14a does not change.

Then, even if the terminal A turns from "1" to "0", the output of the OR circuit 12a does not change and holds "1", when "0" comes from the point P. When the "0" signal reaches the terminal B and reaches the terminal of the OR circuit 12a connected to the point Q through the input buffer 40, the output of the OR circuit 12a becomes "0". In this case, the high one-shot buffer 14a does not generate one-shot signal.

Moreover, when "0" reaches any one of the input terminals of the AND circuit 12b, an input to the low one-shot buffer 14b turns to "0", and temporarily drives strongly the N-channel MOSFET 24a and drives the terminal A to the earth side. This timing is almost the same as the timing that the N-channel MOSFET 52b drives the terminal B to "0". As described above, both terminal A and B can be "0".

When the control circuits comprises the OR circuit and the AND circuit as described above, operation of the one-shot buffer can be rapidly completed. That is, the operation is approximately completed in an operation period of the one-shot buffer on the side to which the external signal is input. Therefore, it becomes easy to shorten the data transfer interval to about the operation period.

Figure 5:
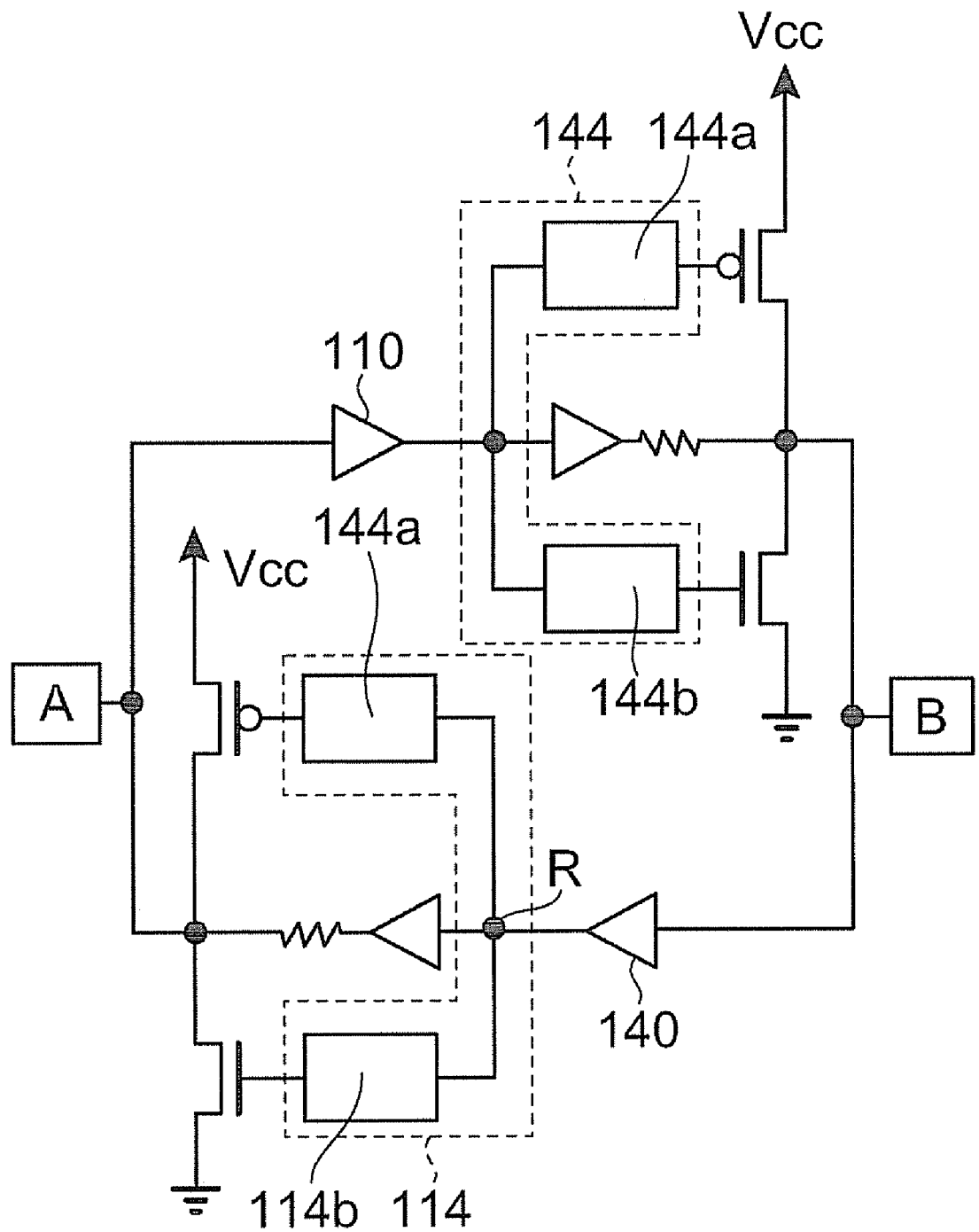
FIG. 5 is a block diagram of a bidirectional buffer circuit according to a comparative example.

FIG. 5 is a block diagram of a bidirectional buffer circuit according to a comparative example. That is, this comparative example detects an input external signal and does not have a control circuit that can rapidly operate an one-shot buffer. When a propagation delay time of a first input buffer 110 is T1 and an operation time of a one-shot buffer 144 is t1, an one-way data transfer interval from a terminal A to a terminal B becomes about ($T_{D1}$+t1).

Moreover, the propagation delay time from the terminal B to the terminal A is set to be T2, and a time that a one-shot buffer 114 operates is set to be t2. When the external signal "1" is input to the terminal A, the high one-shot buffer 114 starts driving and drives the terminal A after about the delay time TD2 from rising of the output of an input buffer 140, as shown by dashed line in FIG. 4F. Therefore, about period of (T1+$T_{D2}$) is required until the signal reaches the point R, and then, in the period of t2, the one-shot buffer 114 continues driving the terminal A. It is difficult to input a new external signal to the terminal A in this period. That is, the bidirectional data transfer interval requires about (T1+$T_{D2}$+t2). The operation times t1, t2 of the one-shot buffers are set to be so that a load can be sufficiently driven. Therefore, due to a condition of ($T_{D2}$+t2)>T2, the bidirectional data transfer interval requires at least (T1+T2).

By contrast, in the second embodiment, it is needless to wait until the signal goes through the terminal B and returns to the terminal. Thus, the operation of the one-shot buffer 14 on the terminal A side is completed. That is, an interval that data can be input to the terminal A can be shortened to the operation time t2 of the high one-shot buffer 14a, and high data transfer rate becomes easy.

Because load conditions are hardly extremely different, generally, t1 and t2 are hardly largely different.

As described above, the bidirectional buffer circuit in this embodiment can hold the data transfer time short without requiring the switching signal of the signal transmission direction. Signal lines for transmitting the switching signal make the board structure and design complex, and therefore cost increases. On the other hand, in a buffer circuit, a circuit for interpreting the communication contents and understanding the propagation direction may be disposed. However, this buffer circuit is not practical because the circuit scale becomes too large for applications such as buffer and signal level conversion.

In this embodiment in which the signal transmission direction is quickly detected by the control circuit with the small number of the logic gates, the number of additional hardware is small. Therefore its structure is simple and downsizing of electronic devices becomes easy.

Figure 6:
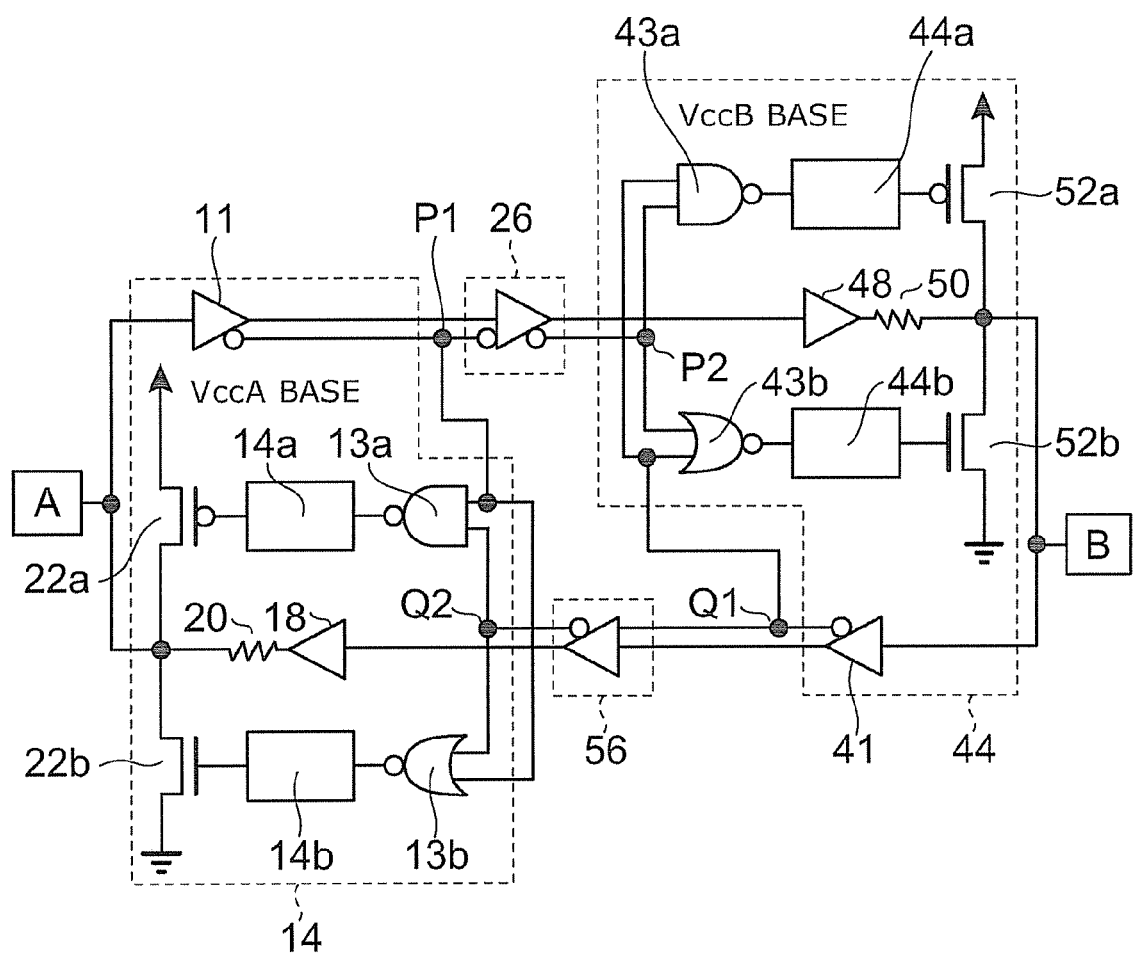
FIG. 6 is a block diagram of a signal level conversion circuit according to a third embodiment.

FIG. 6 is a block diagram of a signal level conversion circuit according to a third embodiment of the invention. Moreover, FIGS. 7A to 7F are its timing charts.

This embodiment has two differential level shifters that are signal level conversion means and functions as the signal level conversion circuit without a direction switching signal. A first differential level shifter 26 is disposed between a first input buffer 11 and the output buffer 48, and a differential level shifter 56 is disposed between a second input buffer 41 and the output buffer 18.

The external circuit connected to the terminal A is driven by VccA-system power voltage, and the external circuit connected to the terminal B is driven by VccB-system power voltage. The signal level conversion circuit of this embodiment is inserted between external circuits operating in VccA and VccB that are different power voltage. In this case, the power voltage is selected in the range of, for example, 1.1 to 3.6 V.

The signal level conversion circuit without the direction switching signal has a problem that a long time elapses until the input signal returns to the one terminal after going through to the other terminal, similarly to the bidirectional buffer circuit. That is, in addition to the slow operation rate of the differential level shifter, a signal passes through the differential level shifters 26 and 56 while the signal shuttles between the terminals. Therefore, a delay time becomes long. A control circuits 13, 43 have NAND circuits 13a, 43a and NOR circuits 13b, 43b, respectively.

Figure 7A:
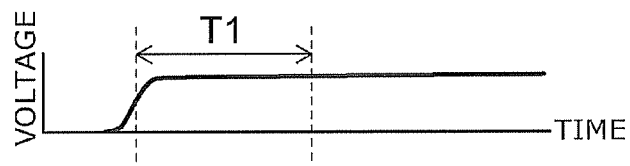
FIGS. 7A to 7F are timing charts describing the operation of the third embodiment.
Figure 7B:
Figure 7C:
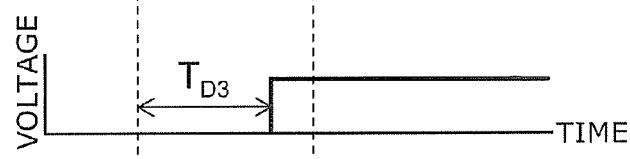

As shown in FIG. 7A, when an external signal "1" is input to the terminal A, an output of the input buffer 11 turns to "1" as shown in FIG. 7B at about the same time. However, an operation time of the first differential level shifter 26 is long, and therefore, a delay time $T_{D3}$ becomes long, and an input to the high one-shot buffer 44a is delayed as shown in FIG. 7C.

After the delay time $T_{D3}$ elapses, the external signal "1" reaches the terminal connected to an input gate point P2 of a NAND circuit 43a. An output of the NAND circuit 43a turns to "1", and is input to the high one-shot buffer 44a on the terminal B side as shown in FIG. 7C. An output of the high one-shot buffer 44a to which "1" is input becomes like FIG. 2C, and starts driving of the P-channel MOSFET 52a. As described above, the P-channel MOSFET 52a turns ON and temporarily drives strongly the terminal B to the VccB side. When driving is completed, the gate turns to plus, and therefore, the P-channel MOSFET 52a turns OFF, and the drain side becomes open.

Figure 7D:
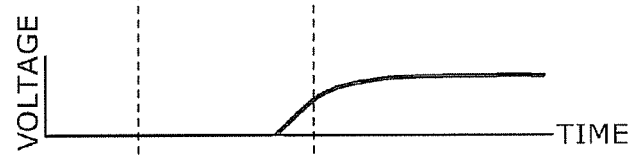
Figure 7E:
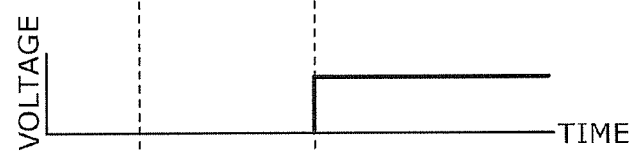

When the terminal B starts to be driven by the high one-shot buffer 44a, the terminal B starts to rise toward "1". If the external load on the terminal B side is heavy, rising becomes mild as shown in FIG. 7D. When the output of the terminal B exceeds the input threshold value of the input buffer 40, its output turns to "1". That is, the signal propagation delay time between the output of the input buffer 11 and the output of the input buffer 41 becomes about T1. In this case, even when the power voltage of the terminal A is based on the VccA, power voltage of the differential level shifter 26 and the P-channel MOSFET 52a is VccB. Therefore, the signal level of the terminal B can be converted into VccB.

Figure 7F:
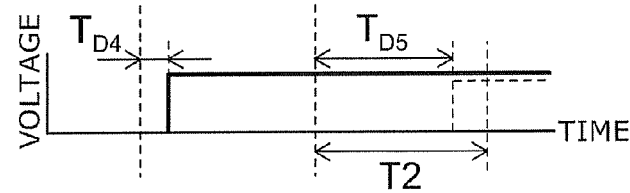

On the other hand, the external signal "1" to the terminal A does not pass through the differential level shifter and reaches the terminal connected to the input point P1 of the NAND circuit 13a in a short delay time $T_{D4}$. Therefore, the output of the NAND circuit 13a turns to "1", and "1" is input to the high one-shot buffer 14a on the terminal A side as shown in FIG. 7F. When the control circuit does not exist, the input of the high one-shot buffer 14a rises after the long delay time $T_{D5}$ by the differential level shifter like dashed line of FIG. 7F. Therefore, the operation of the high one-shot buffer 14a delays.

In this embodiment, for example, the P-channel MOSFET 22a turns ON, the terminal A is temporarily driven strongly to the VccA side. When driving is completed, the gate becomes plus. Therefore, the P-channel MOSFET 22a turns OFF, and the drain side of the P-channel MOSFET 22a becomes open. Even when the power voltage of the terminal B is based on the VccB, power voltage of the differential level shifter 56 and the P-channel MOSFET 22a is VccA, and therefore, the signal level of the terminal A can be converted into VccA.

In this embodiment, even in the case of the signal level conversion circuit having the differential level shifter with a long operation time, driving of the one-shot buffer can be started without waiting for a period that the external signal passes through the differential level shifter. Therefore, it is easy to enhance the data transfer rate.

As described above, according to this embodiment, the signal level conversion circuit having a simple structure with holding the data transfer rate high is provided, and the downsizing of the portable electronic devices becomes easy.

In this embodiment, the OR circuits 42a, 12a in the second embodiment as shown in FIG. 3 are replaced by NAND circuits, and the respective inputs are inverted. Moreover, the AND circuits 42b, 12b in FIG. 3 are replaced by NOR circuits, and the respective inputs are inverted. That is, it is utilized that logically, an OR circuit is equivalent to an NAND circuit in which its respective inputs are inverted, and an AND circuit is equivalent to an NOR circuit in which its respective inputs are inverted.

In general, as the OR circuit is often constituted by connecting an inversion circuit to an output of the NOR circuit, the NOR circuit has a smaller size and higher speed than the OR circuit. As the AND circuit is often constituted by connecting an inversion circuit to an output of the NAND circuit, the NAND circuit has a smaller size and a higher speed than the AND circuit. Moreover, in this embodiment, the differential level shifters 26, 56 are used. In each of the differential level shifters, in addition to a general input signal, its inverted signal is also used as an input, and a normal signal and its inverted signal are output according to these input signals As the respective inversions thereof are preliminarily provided before and after the level shift, it is needless to generate the inversion again. Therefore, for realizing the OR function, without using the NOR circuit and an inverter, it is sufficient to add the NAND circuit to the preliminarily existing inversion signal. Moreover, when there is the NOR circuit, the function of AND can be realized. As described above, in this embodiment, speeding up with avoiding increase of the number of the gates becomes easy. That is, its effect is large with respect to the amount of the added hardware. The level shifter is not limited to the differential type, but a constitution becomes easy in case of the differential type as described above.

In the first to third embodiments, the cases where the external signal is input to the terminal A has been described, but naturally, the external signal may be input to the terminal B.

As described above, the embodiments of the invention has been described. However, the invention is not limited to these embodiments. Design modifications by those skilled in the art of arrangement, conductivity type, size, and so forth of the control circuit, the one-shot buffer, the input buffer, the output buffer, the level shifter, the delay circuit, the OR circuit, the AND circuit, the NOR circuit, the NAND circuit, and MOSFET constituting the invention are also included in the scope of the invention as long as not departing from the spirit of the invention.

The invention claimed is:

1. A bidirectional buffer circuit comprising:
   a first terminal;
   a second terminal;
   a first output buffer to which a signal from the first terminal is input and which outputs the signal to the second terminal;
   a first one-shot buffer control circuit to which the signal from the first terminal and a signal from the second terminal are input and which generates a first control signal according to an earlier arriving signal out of the signal from the first terminal and the signal from the second terminal;
   a first one-shot buffer temporarily driving the second terminal by the first control signal;
   a second output buffer to which a signal from the second terminal is input and which outputs the signal to the first terminal;
   a second one-shot buffer control circuit to which the signal from the first terminal and the signal from the second terminal are input and which generates a second control signal according to an earlier arriving signal out of a signal from the first terminal and the signal from the second terminal;
   and a second one-shot buffer temporarily driving the first terminal by the second control signal.

2. The buffer circuit according to claim 1, further comprising:
   a first input buffer to which a signal from the first terminal is input and which outputs the signal to the first output buffer; and
   a second input buffer to which a signal from the second terminal is input and which outputs the signal to the second output buffer, the signal from the first terminal being input to each of the first and second one-shot buffer control circuits through the first input buffer, and the signal from the second terminal being input to each of the first and second one-shot buffer control circuits through the second input buffer.

3. The buffer circuit according to claim 1, wherein each of the first and second one-shot buffers has a high one-shot buffer and a low one-shot buffer, the high one-shot buffer driving the first and second terminals when a signal switching from a low level to a high level is input to one terminal of the first and second terminals, and the low one-shot buffer driving the first and second terminals when a signal switching from the high level to the low level to the one terminal.

4. The buffer circuit according to claim 3, wherein the first one-shot buffer drives the second terminal through a first switching element, and the second one-shot buffer drives the first terminal through a second switching element.

5. The buffer circuit according to claim 4, wherein each of the first and second switching elements has an element driven by the high one-shot buffer and an element driven by the low one-shot buffer.

6. The buffer circuit according to claim 5, wherein the element driven by the high one-shot buffer is a P-channel MOSFET, and the element driven by the low one-shot buffer is an N-channel MOSFET.

7. The buffer circuit according to claim 4, wherein the one-shot buffers drive the first and second switching elements for a predetermined time, respectively.

8. The buffer circuit according to claim 7, wherein the high one-shot buffer has a first inverter, a first delay circuit, and an NAND circuit, and the predetermined time can be set by using delay time of the first inverter and delay time of the first delay circuit, and the low one-shot buffer has a second inverter, a second delay circuit, and an NOR circuit, and the predetermined time can be set by using delay time of the second inverter and delay time of the second delay circuit.

9. The buffer circuit according to claim 3, wherein each of the first and second one-shot buffer control circuits has an OR circuit to which the signal from the first terminal and the signal from the second terminal are input and which outputs the signals to the high one-shot buffer, and an AND circuit to which the signal from the first terminal and the signal from the second terminal are input and which outputs signals to the low one-shot buffer.

10. A signal level conversion circuit comprising:
    a first terminal to which a signal of a first power voltage is input and output;
    a second terminal to which a signal of a second power voltage is input and output;
    a first level shifter to which a signal from the first terminal is input and which outputs a first level conversion signal;
    a first output buffer to which the first level conversion signal is input and which outputs the signal to the second terminal;
    a first one-shot buffer control circuit to which the first level conversion signal and a signal from the second terminal are input and which generates a first control signal according to an earlier arriving signal out of the first level conversion signal and the signal from the second terminal;
    a first one-shot buffer temporarily driving the second terminal by the first control signal;
    a second level shifter to which a signal from the second terminal is input and which outputs a second level conversion signal;
    a second output buffer to which the second level conversion signal is input and which outputs the signal to the first terminal;
    a second one-shot buffer control circuit to which a signal from the first terminal and the second level conversion signal are input and which generates a second control signal according to an earlier arriving signal out of a signal from the first terminal and the second level conversion signal; and
    a second one-shot buffer temporarily driving the first terminal by the second control signal.

11. The conversion circuit according to claim 10, wherein each of the first and second level shifters is a differential type.

12. The conversion circuit according to claim 10, further comprising:
    a first input buffer to which a signal from the first terminal is input and which outputs the signal to the level shifter; and
    a second input buffer to which a signal from the second terminal is input and which can outputs the signal to the level shifter, the signal from the first terminal being input to the second one-shot buffer control circuit through the first input buffer and being input to the first one-shot buffer control circuit through the first level shifter, and the signal from the second terminal being input to the first one-shot buffer control circuit through the second input buffer and being input to the second one-shot buffer control circuit through the second level shifter.

13. The conversion circuit according to claim 10, wherein each of the first and second one-shot buffers has a high one-shot buffer and a low one-shot buffer, the high one-shot buffer driving the first and second terminals when a signal switching from a low level to a high level is input to one terminal of the first and second terminals, and the low one-shot buffer driving the first and second terminals when a signal switching from the high level to the low level to the one terminal.

14. The conversion circuit according to claim 13, wherein the first one-shot buffer drives the second terminal through a first switching element, and the second one-shot buffer drives the first terminal through a second switching element.

15. The conversion circuit according to claim 14, wherein each of the first and second switching elements has an element driven by the high one-shot buffer, and an element driven by the low one-shot buffer.

16. The conversion circuit according to claim 14, wherein the one-shot buffers drive the first and second switching elements for a predetermined time, respectively.

17. The conversion circuit according to claim 16, wherein the high one-shot , buffer has a first inverter, a first delay circuit, and an NAND circuit, and the predetermined time is set by using delay time of the first inverter and delay time of the first delay circuit, and the low one-shot buffer has a second inverter, a second delay circuit, and an NOR circuit, and the predetermined time is set by using delay time of the second inverter and delay time of the second delay circuit.

18. A signal level conversion circuit comprising:
a first terminal to which a signal of a first power voltage is input and output; a second terminal to which a signal of a second power voltage is input and output;
a first input buffer to which a signal from the first terminal is input and which outputs a differential signal;
a first differential level shifter configured to output a first level conversion signal on the basis of an output from the first input buffer;
a first output buffer to which the first level conversion signal is input and which outputs the signal to the second terminal;
a second input buffer to which a signal from the second terminal is input and which outputs a differential signal;
a second differential level shifter configured to output a second level conversion signal on the basis of an output from the second input buffer;
a second output buffer to which the second level conversion signal is input and which outputs the signal to the first terminal;
a first one-shot buffer control circuit to which the first level conversion signal and a signal from the second terminal are input and which generates a first control signal according to an earlier arriving signal out of the first level conversion signal and the signal from the second terminal;
a first one-shot buffer temporarily driving the second terminal by the first control signal;
a second one-shot buffer control circuit to which a signal from the first terminal and the second level conversion signal are input and which generates a second control signal according to an earlier arriving signal out of the signal from the first terminal and the second level conversion signal; and
a second one-shot buffer temporarily driving the first terminal by the second control signal.

19. The conversion circuit according to claim 18, wherein each of the first and second one-shot buffers has a high one-shot buffer and a low one-shot buffer, the high one-shot buffer driving the first and second terminals when a signal switching from a low level to a high level is input to one terminal of the first and second terminals, and the low one-shot buffer driving the first and second terminals when a signal switching from the high level to the low level to the one terminal.

20. The conversion circuit according to claim 19, wherein the first one-shot buffer control circuit to which the inversion output signal from the first differential level shifter and the inversion output signal from the second input buffer are input has an NAND circuit outputting the first control signal to the high one-shot buffer and an NOR circuit outputting the first control signal to the low one-shot buffer, and the second one-shot buffer control circuit to which the inversion output signal from the first input buffer and the inversion output signal from the second differential level shifter are input has an NAND circuit outputting the second control signal to the high one-shot buffer and an NOR circuit outputting the second control signal to the low one-shot buffer.

* * * * *